US008907547B2

(12) United States Patent
Tai et al.

(10) Patent No.: US 8,907,547 B2
(45) Date of Patent: Dec. 9, 2014

(54) COMPOSITE SUBSTRATE

(71) Applicants: NGK Insulators, Ltd., Aichi (JP); NGK Ceramic Device Co., Ltd., Aichi (JP)

(72) Inventors: Tomoyoshi Tai, Inazawa (JP); Yasunori Iwasaki, Kitanagoya (JP); Yuji Hori, Owariasahi (JP); Takahiro Yamadera, Nagoya (JP); Ryosuke Hattori, Ichinomiya (JP); Kengo Suzuki, Nagoya (JP)

(73) Assignee: NGK Insulators, Ltd., Aichi (JP)

( * ) Notice: Subject to any disclaimer, the term of this patent is extended or adjusted under 35 U.S.C. 154(b) by 0 days.

(21) Appl. No.: 14/228,452

(22) Filed: Mar. 28, 2014

(65) Prior Publication Data

US 2014/0210317 A1 Jul. 31, 2014

Related U.S. Application Data

(63) Continuation of application No. PCT/JP2013/080399, filed on Nov. 11, 2013.

(30) Foreign Application Priority Data

Nov. 14, 2012 (JP) ................................ 2012-250071

(51) Int. Cl.
H01L 41/09 (2006.01)
H03H 9/25 (2006.01)
H01L 41/053 (2006.01)
H01L 41/083 (2006.01)

(52) U.S. Cl.
CPC .......... *H01L 41/0838* (2013.01); *H01L 41/053* (2013.01)
USPC ..................................... 310/358; 310/313 R

(58) Field of Classification Search
USPC ............... 310/313 R, 313 A–313 D, 346, 358
See application file for complete search history.

(56) References Cited

U.S. PATENT DOCUMENTS 6,229,250 B1 * 5/2001 Nakanishi et al. ............ 310/364
8,304,966 B2 * 11/2012 Suenaga et al. ............... 310/358
(Continued)

FOREIGN PATENT DOCUMENTS

JP 2004-343359 A 12/2004
JP 2005-252550 A 9/2005
(Continued)

OTHER PUBLICATIONS

International Search Report and Written Opinion for PCT Patent App. No. PCT/JP2013/080399 (Dec. 17, 2013) with English language translation of the Written Opinion.

*Primary Examiner* — Thomas Dougherty
(74) *Attorney, Agent, or Firm* — Cermak Nakajima & McGowan LLP; Tomoko Nakajima

(57) ABSTRACT

A composite substrate according to the present invention includes a piezoelectric substrate that is a single-crystal lithium tantalate or lithium niobate substrate, a support substrate that is a single-crystal silicon substrate, and an amorphous layer joining together the piezoelectric substrate and the support substrate. The amorphous layer contains 3 to 14 atomic percent of argon. The amorphous layer includes, in order from the piezoelectric substrate toward the composite substrate, a first layer, a second layer, and a third layer. The first layer contains a larger amount of a constituent element (such as tantalum) of the piezoelectric substrate than the second and third layers. The third layer contains a larger amount of a constituent element (silicon) of the support substrate than the first and second layers. The second layer contains a larger amount of argon than the first and third layers.

5 Claims, 8 Drawing Sheets

(56) References Cited

U.S. PATENT DOCUMENTS

| | | |
|---|---|---|
| 2004/0002205 A1* | 1/2004 | Chen et al. ................... 438/597 |
| 2004/0226162 A1 | 11/2004 | Miura et al. |
| 2005/0194864 A1* | 9/2005 | Miura et al. ............. 310/313 R |
| 2010/0088868 A1 | 4/2010 | Kando et al. |
| 2010/0244631 A1 | 9/2010 | Kobayashi et al. |

FOREIGN PATENT DOCUMENTS

| | | |
|---|---|---|
| JP | 2010-232725 A | 10/2010 |
| WO | WO2009/081651 A1 | 7/2009 |

* cited by examiner

COMPOSITE SUBSTRATE

BACKGROUND OF THE INVENTION

1. Field of the Invention

The present invention relates to composite substrates.

2. Description of the Related Art

Surface acoustic wave devices (SAW devices) are widely used as bandpass filters in communication equipment such as cellular phones. SAW devices are manufactured, for example, from a composite substrate including a piezoelectric substrate, such as a lithium tantalate (LT) or lithium niobate (LN) substrate, and a support substrate, such as a sapphire or silicon substrate, that are joined together. A piezoelectric substrate, such as an LT or LN substrate, has a large electromechanical coupling coefficient and is therefore advantageous for achieving filter characteristics over a wide band, although this substrate is disadvantageous in that it has poor temperature stability. On the other hand, a support substrate, such as a sapphire or silicon substrate, has superior temperature stability, although this substrate is disadvantageous in that it has a small electromechanical coupling coefficient. In contrast, a composite substrate manufactured by joining the two substrates together is advantageous in that it has a large electromechanical coupling coefficient and superior temperature stability.

PTL 1 discloses a composite substrate manufactured by activating joining surfaces of a piezoelectric substrate and a support substrate with an ion beam, neutralized beam, or plasma of an inert gas or oxygen and then joining the two substrates together at room temperature or under heating at 100° C. or lower. PTL 1 also discloses that the joining is followed by annealing at a relatively low temperature, i.e., 200° C. or lower, to further improve the adhesion strength between the two substrates. PTL 1 also discloses that a composite substrate formed by activating the joining surfaces of the two substrates with an irradiation beam of argon atoms and then joining together the joining surfaces of the two substrates includes an amorphous layer between the substrates. Such a composite substrate including an amorphous layer between the substrates is also disclosed in PTL 2.

CITATION LIST

Patent Literature

PTL 1: JP 2004-343359 A
PTL 2: JP 2005-252550 A

SUMMARY OF INVENTION

Technical Problem

Such a composite substrate may be subjected to a high-temperature process, for example, after being cut into a chip. If the composite substrate has low adhesion strength between the two substrates, they may peel off during the high-temperature process.

In light of the foregoing problem, a primary object of the present invention is to provide a composite substrate including a piezoelectric substrate and a support substrate joined together with sufficiently high adhesion strength between the two substrates.

Solution to Problem

A composite substrate according to the present invention is:

a composite substrate including a piezoelectric substrate that is a single-crystal substrate composed of lithium tantalate or lithium niobate, a support substrate that is a single-crystal silicon substrate, and an amorphous layer joining together the piezoelectric substrate and the support substrate, wherein
the amorphous layer contains 3 to 14 atomic percent of Ar.

This composite substrate has sufficiently high adhesion strength between the two substrates. Although the mechanism has not been fully understood, it is believed that the fact that the amorphous layer contains 3 to 14 atomic percent of argon contributes to the adhesion strength. The amorphous layer may be composed, for example, of only one layer or two or more layers. The amorphous layer is effective in providing sufficiently high adhesion strength provided that the entire amorphous layer contains 3 to 14 atomic percent of argon. The entire amorphous layer may contain 3 to 10 atomic percent of argon.

In the composite substrate according to the present invention, the amorphous layer preferably has a thickness of 4 to 12 nm. This provides sufficient heat resistance at 400° C. or higher.

In the composite substrate according to the present invention, preferably, the amorphous layer includes, in order from the piezoelectric substrate toward the composite substrate, a first layer, a second layer, and a third layer, the first layer contains a larger amount of a constituent element of the piezoelectric substrate than the second and third layers, the third layer contains a larger amount of a constituent element of the support substrate than the first and second layers, and the second layer contains a larger amount of argon than the first and third layers. Such a composite substrate has a higher adhesion strength between the two substrates than a composite substrate including an amorphous layer composed of two layers.

In this case, the third layer is preferably thicker than the first and second layers. When a composite substrate including an amorphous layer composed of three layers is actually fabricated, the third layer is thicker than the first and second layers, which probably contributes to the improved adhesion strength. In this case, the third layer may be thicker than the sum of the thicknesses of the first and second layers.

The composite substrate according to the present invention preferably has an iron content below a detection limit (less than 0.1 atomic percent). Contamination with iron is undesirable because it may adversely affect devices, such as SAW devices, fabricated from the composite substrate. For example, contamination with iron may result in leakage of electric field and thus dissipation of energy.

In the composite substrate according to the present invention, the piezoelectric substrate used is a single-crystal substrate composed of lithium tantalate or lithium niobate. The size of the piezoelectric substrate is, for example, but not limited to, 50 to 150 mm in diameter and 10 to 50 μm in thickness. The support substrate used is a single-crystal silicon substrate. The size of the support substrate is, for example, but not limited to, 50 to 150 mm in diameter and 100 to 500 μm in thickness. The amorphous layer includes, in order from the piezoelectric substrate toward the composite substrate, a first layer, a second layer, and a third layer. In this case, the first to third layers all contain argon. The first layer contains a larger amount of a constituent element (such as tantalum or niobium) of the piezoelectric substrate than the second and third layers. The third layer contains a larger amount of a constituent element (silicon) of the support substrate than the first and second layers. The second layer contains a larger amount of argon than the first and third layers.

A method for manufacturing a composite substrate according to the present invention includes the steps of:

(a) preparing a piezoelectric substrate that is a single-crystal substrate composed of lithium tantalate or lithium niobate and a support substrate that is a single-crystal silicon substrate;

(b) irradiating a joining surface of the piezoelectric substrate and a joining surface of the support substrate with a neutral argon atom beam in a vacuum;

(c) cooling the piezoelectric substrate and the support substrate;

(d) joining together the piezoelectric substrate and the support substrate by bringing into contact the joining surfaces of the two substrates irradiated with the beam and pressing the two substrates together; and (e) after the joining, polishing the piezoelectric substrate to a predetermined thickness and then annealing the two substrates at a temperature higher than 200° C.

According to this method for manufacturing a composite substrate, the composite substrate according to the present invention described above can be relatively easily manufactured.

In step (a), a piezoelectric substrate is prepared such as a 36°-rotated Y-cut X-propagation LT substrate, 42°-rotated Y-cut X-propagation LT substrate, X-cut 112.2°-rotated Y-propagation LT substrate, 127.86°-rotated Y-cut X-propagation LN substrate, Y-cut Z-propagation LN substrate, or 64°-rotated Y-cut X-propagation LN substrate. Also prepared is a support substrate such as a single-crystal silicon substrate manufactured by the Czochralski process or the floating zone process.

In step (b), a neutral argon atom beam is used. Alternatively, an argon ion beam may be used instead of a neutral argon atom beam. However, a neutral argon atom beam is preferably used because the use of an argon ion beam might result in the joining surfaces being contaminated with the material of the vacuum chamber (such as iron or chromium). A neutral argon atom beam is also preferably used if the amorphous layer has a three-layer structure.

In step (c), the piezoelectric substrate and the support substrate are cooled. If the two substrates are joined together without being cooled, they readily peel off after joining because of their large difference in thermal expansion during joining. The piezoelectric substrate and the support substrate are preferably cooled to 20° C. to 50° C., more preferably 20° C. to 30° C.

In step (d), the piezoelectric substrate and the support substrate are joined together by bringing into contact the surfaces of the two substrates irradiated with the beam and pressing the two substrates together. The pressure during pressing may be set depending on, for example, the sizes of the substrates.

In step (e), the piezoelectric substrate is polished to a predetermined thickness (for example, 10 to 50 µm), and the two substrates are then annealed at a temperature higher than 200° C. This reduces thermal stress and also improves the adhesion strength between the two substrates. The annealing temperature is preferably 240° C. to 280° C., more preferably 250° C. to 270° C. In step (e), the two substrates are preferably annealed at a temperature of 80° C. or higher (preferably at a temperature of 80° C. to 110° C.) after the joining and before the polishing. This further improves the adhesion strength.

DETAILED DESCRIPTION OF THE INVENTION

Examples

Example 1

An LT substrate having a mirror finish on each side thereof and having a thickness of 230 µm and a silicon substrate having a mirror finish on each side thereof and having a thickness of 250 µm were prepared. The LT substrate used was a 42°-rotated Y-cut X-propagation LT substrate (42° Y-X LT), which is rotated by 42° from the Y axis toward the Z axis about the X axis, which is the direction in which a surface acoustic wave propagates. After the joining surface of each substrate was cleaned to remove soil therefrom, it was introduced into a vacuum chamber. The joining surface of each substrate was irradiated with a high-speed neutral argon atom beam (at an acceleration voltage of 1 kV and an argon flow rate of 60 sccm) in a vacuum on the order of $10^{-6}$ Pa for 70 seconds. After irradiation, each substrate was left standing for 10 minutes to cool the substrate to 26° C. to 28° C. The LT substrate and the silicon substrate were then joined together by bringing into contact the surfaces of the two substrates irradiated with the beam and pressing the two substrates together at 4.90 kN for 2 minutes. After joining, the LT substrate was polished to a thickness of 30 µm, and the two substrates were then annealed at 260° C. to obtain a composite substrate.

Figure 1:
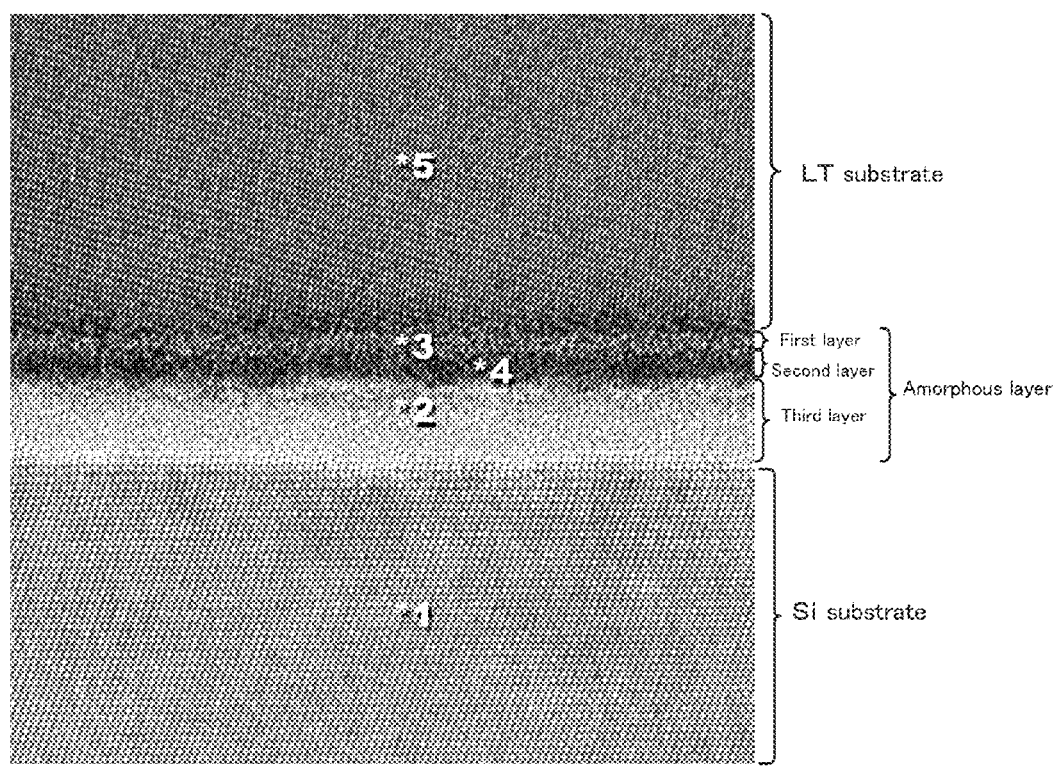
FIG. 1 is a cross-sectional TEM image of a composite substrate of Example 1.
Figure 2:
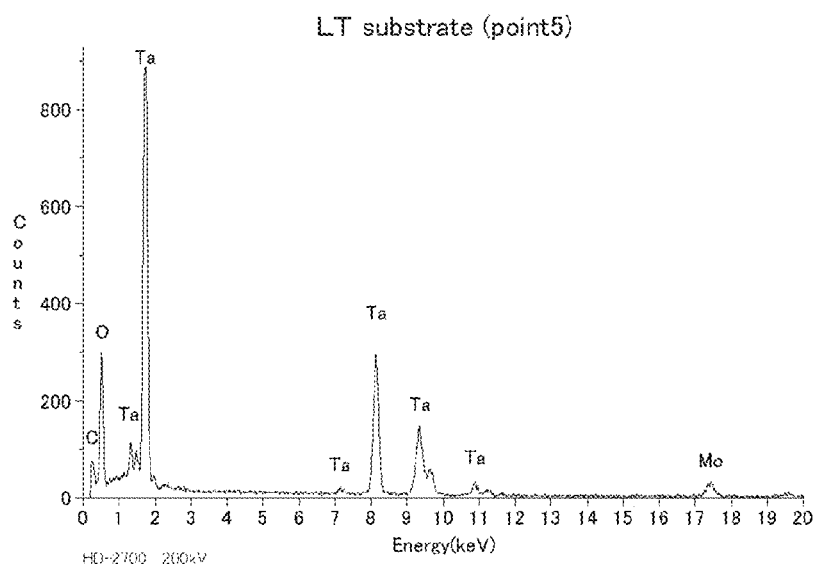
FIG. 2 is an EDX graph of an LT substrate in the composite substrate of Example 1.
Figure 3:
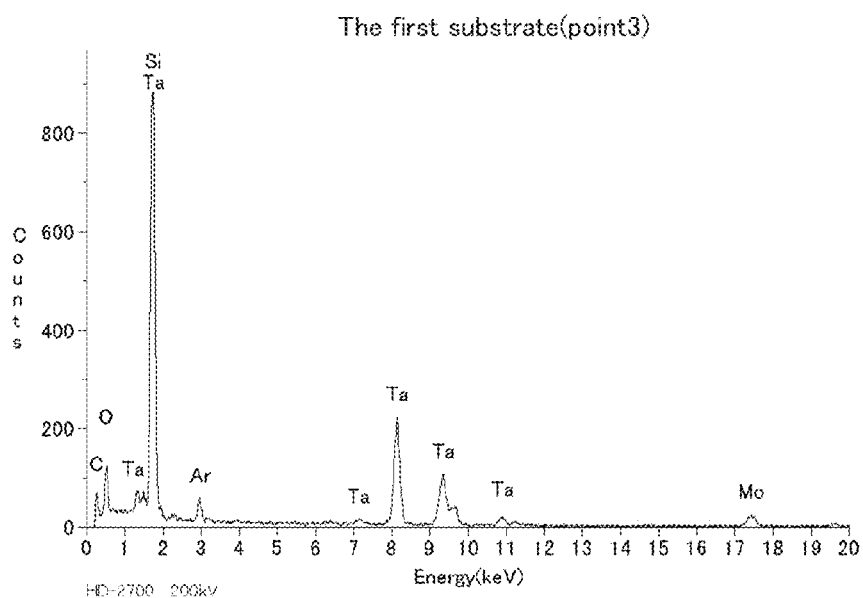
FIG. 3 is an EDX graph of a first layer of an amorphous layer in the composite substrate of Example 1.
Figure 4:
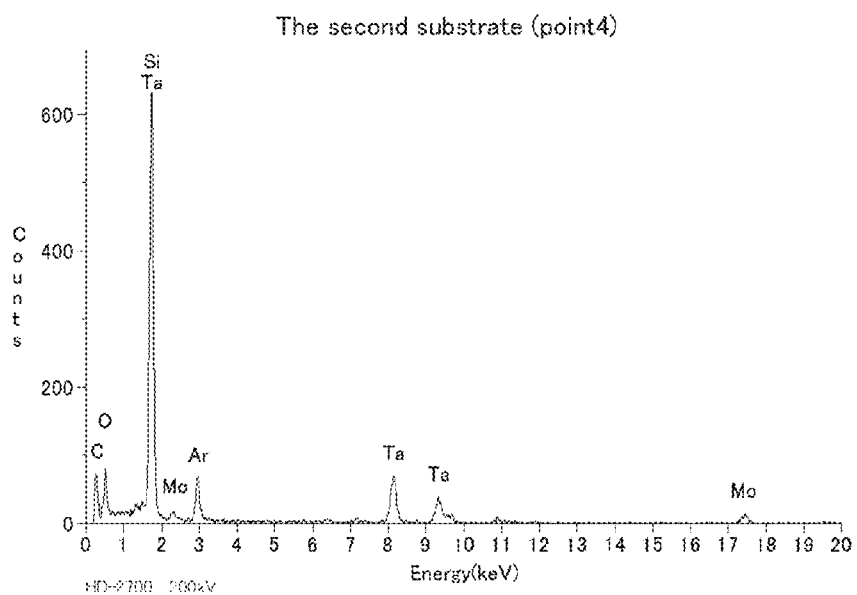
FIG. 4 is an EDX graph of a second layer of the amorphous layer in the composite substrate of Example 1.
Figure 5:
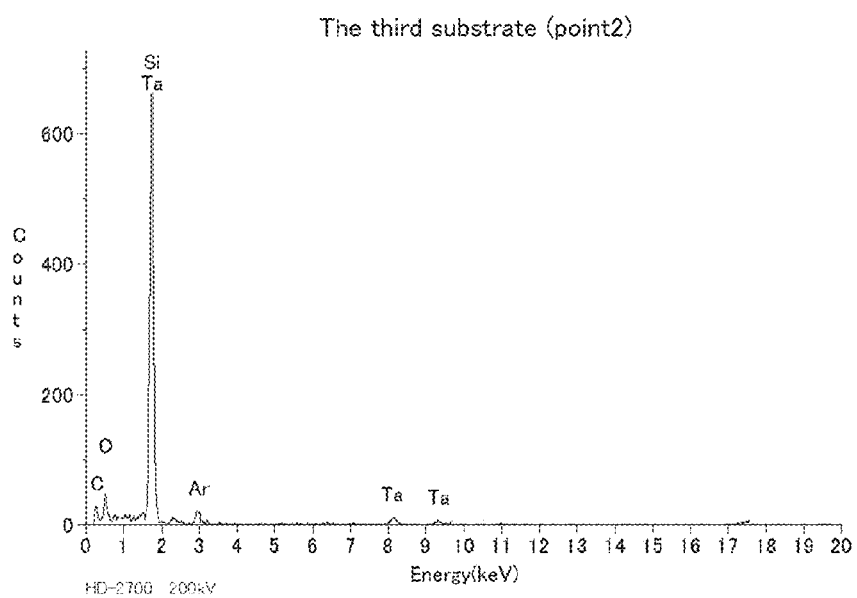
FIG. 5 is an EDX graph of a third layer of the amorphous layer in the composite substrate of Example 1.
Figure 6:
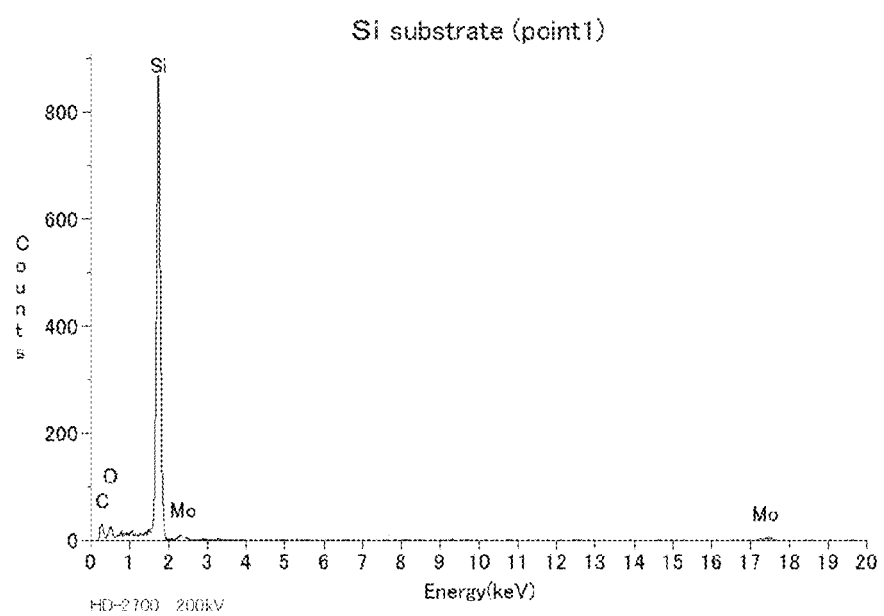
FIG. 6 is an EDX graph of a silicon substrate in the composite substrate of Example 1.

The composite substrate was cut to examine a cross-section under a transmission electron microscope (TEM). The results are shown in FIG. 1. As shown in FIG. 1, the amorphous layer had a thickness of 7 nm. The amorphous layer included, in order from the LT substrate toward the silicon substrate, a first layer, a second layer, and a third layer. The third layer was thicker than the first and second layers. The LT substrate, the first to third layers of the amorphous layer, and the silicon substrate were examined by composition analysis and elemental analysis using EDX. FIGS. 2 to 6 show the results of the composition analysis. In FIGS. 2 to 6, "point n" (where n is an integer of 1 to 5) denotes the position of "*n" in FIG. 1, which also applies to Table 1, described later. As can be seen from the results of the composition analysis, argon was detected in all of the first to third layers. The molybdenum peaks in FIGS. 2 to 6 are attributed to the sample holder. Table 1 shows the results of the elemental analysis. As can be seen from Table 1, the first layer contained 5 atomic percent of argon atoms, the second layer contained 9 atomic percent of argon atoms, and the third layer contained 3 atomic percent of argon atoms. No iron atoms were detected in any portion. The entire amorphous layer contained 8 atomic percent of argon atoms. A 2 mm square chip was cut from the composite substrate and was heated on a hot plate. After the chip was gradually heated from room temperature above 300° C., it was found to suffer no damage such as cracks or peeling. Because further heating was difficult on the hot plate, the chip was transferred to a rapid annealing furnace and was rapidly heated to 400° C. The chip was removed from the furnace and was found to suffer no damage.

TABLE 1

| | | Point | Element, By Unit of atm % | | | |
|---|---|---|---|---|---|---|
| | | | Si | Ar | Ta | Fe |
| LT Substrate | | 5 | 35 | 0 | 65 | 0 |
| Amorphous Layer | First Layer | 3 | 50 | 5 | 45 | 0 |
| | Second Layer | 4 | 70 | 9 | 21 | 0 |
| | Third Layer | 2 | 94 | 3 | 3 | 0 |
| Si Substrate | | 1 | 100 | 0 | 0 | 0 |

Example 2

A composite substrate was manufactured as in Example 1 except that each substrate was irradiated with a high-speed neutral argon atom beam for 20 seconds, and a portion thereof was cut to examine a cross-section under a TEM. As a result, the amorphous layer had a thickness of about 4 nm. The amorphous layer included, in order from the LT substrate toward the silicon substrate, a first layer, a second layer, and a third layer. The third layer was thicker than the first and second layers. The LT substrate, the first to third layers of the amorphous layer, and the silicon substrate were examined by composition analysis and elemental analysis using EDX. According to the composition analysis, argon was detected in all of the first to third layers. According to the elemental analysis, the first layer contained 1.5 atomic percent of argon atoms, the second layer contained 3.9 atomic percent of argon atoms, and the third layer contained 0.7 atomic percent of argon atoms. No iron atoms were detected in any portion. The entire amorphous layer contained 3.0 atomic percent of argon atoms. The first layer contained a larger amount of a constituent element (tantalum) of the piezoelectric substrate than the second and third layers, and the third layer contained a larger amount of a constituent element (silicon) of the support substrate than the first and second layers. When a 2 mm square chip was gradually heated on a hot plate, as in Example 1, the LT substrate peeled off immediately above 400° C.

Example 3

A composite substrate was manufactured as in Example 1 except that each substrate was irradiated with a high-speed neutral argon atom beam for 265 seconds, and a portion thereof was cut to examine a cross-section under a TEM. As a result, the amorphous layer had a thickness of about 12 nm. The amorphous layer included, in order from the LT substrate toward the silicon substrate, a first layer, a second layer, and a third layer. The third layer was thicker than the first and second layers. The LT substrate, the first to third layers of the amorphous layer, and the silicon substrate were examined by composition analysis and elemental analysis using EDX. According to the composition analysis, argon was detected in all of the first to third layers. According to the elemental analysis, the first layer contained 10.8 atomic percent of argon atoms, the second layer contained 16.3 atomic percent of argon atoms, and the third layer contained 8.4 atomic percent of argon atoms. No iron atoms were detected in any portion. The entire amorphous layer contained 14 atomic percent of argon atoms. The first layer contained a larger amount of a constituent element (tantalum) of the piezoelectric substrate than the second and third layers, and the third layer contained a larger amount of a constituent element (silicon) of the support substrate than the first and second layers. When a 2 mm square chip was heated on a hot plate, as in Example 1, the LT substrate peeled off immediately above 400° C.

Example 4

A portion of a composite substrate was cut to examine a cross-section under a TEM as in Example 1 except that each substrate was irradiated with an argon ion beam, rather than with a neutral argon atom beam. As a result, the amorphous layer had a thickness of 8 nm. The amorphous layer included, in order from the LT substrate toward the silicon substrate, a first layer and a second layer. The LT substrate, the first and second layers of the amorphous layer, and the silicon substrate were examined by composition analysis and elemental analysis using EDX. According to the composition analysis, argon was detected in both of the first and second layers. According to the elemental analysis, the first layer contained 3 atomic percent of argon atoms, and the second layer contained 4 atomic percent of argon atoms. No iron atoms were detected in any portion. The entire amorphous layer contained 5 atomic percent of argon atoms. When a 2 mm square chip cut from the composite substrate was heated on a hot plate, the LT substrate peeled off at 350° C.

Example 5

A composite substrate was fabricated as in Example 1 except that the LT substrate was replaced with an LN substrate, and a portion thereof was cut to examine a cross-section under a TEM. As a result, the amorphous layer had a thickness of about 5 nm. The amorphous layer included, in order from the LN substrate toward the silicon substrate, a first layer, a second layer, and a third layer. The third layer was thicker than the first and second layers. The LN substrate, the first to third layers of the amorphous layer, and the silicon substrate were examined by composition analysis and elemental analysis using EDX. According to the composition analysis, argon was detected in all of the first to third layers. According to the elemental analysis, the first layer contained 3.1 atomic percent of argon atoms, the second layer contained 6.3 atomic percent of argon atoms, and the third layer contained 1.6 atomic percent of argon atoms. No iron atoms were detected in any portion. The entire amorphous layer contained 5.4 atomic percent of argon atoms. The first layer contained a larger amount of a constituent element (niobium) of the piezoelectric substrate than the second and third layers, and the third layer contained a larger amount of a constituent element (silicon) of the support substrate than the first and second layers. When a 2 mm square chip was heated on a hot plate, as in Example 1, the LN substrate peeled off immediately above 400° C.

Comparative Example 1

A composite substrate was manufactured as in Example 1 except that each substrate was irradiated with a high-speed neutral argon atom beam for 15 seconds, and a portion thereof was cut to examine a cross-section under a TEM. As a result, the amorphous layer had a thickness of about 2.5 nm. The amorphous layer included, in order from the LT substrate toward the silicon substrate, a first layer, a second layer, and a third layer. The third layer was thicker than the first and second layers. The LT substrate, the first to third layers of the amorphous layer, and the silicon substrate were examined by composition analysis and elemental analysis using EDX. According to the composition analysis, argon was detected in all of the first to third layers. According to the elemental analysis, the first layer contained 1 atomic percent of argon atoms, the second layer contained 3 atomic percent of argon atoms, and the third layer contained 0.4 atomic percent of argon atoms. No iron atoms were detected in any portion. The entire amorphous layer contained 2 atomic percent of argon atoms. When a 2 mm square chip was heated on a hot plate, as in Example 1, the LT substrate peeled off immediately above 300° C.

Comparative Example 2

A composite substrate was manufactured as in Example 1 except that each substrate was irradiated with a high-speed neutral argon atom beam for 600 seconds, and a portion thereof was cut to examine a cross-section under a TEM. As a result, the amorphous layer had a thickness of about 15 nm. The amorphous layer included, in order from the LT substrate toward the silicon substrate, a first layer, a second layer, and a third layer. The third layer was thicker than the first and second layers. The LT substrate, the first to third layers of the amorphous layer, and the silicon substrate were examined by composition analysis and elemental analysis using EDX. According to the composition analysis, argon was detected in all of the first to third layers. According to the elemental analysis, the first layer contained 15 atomic percent of argon atoms, the second layer contained 21 atomic percent of argon atoms, and the third layer contained 13 atomic percent of argon atoms. No iron atoms were detected in any portion. The entire amorphous layer contained 18 atomic percent of argon atoms. When a 2 mm square chip was heated on a hot plate, as in Example 1, the LT substrate peeled off immediately above 300° C.

Comparative Example 3

Figure 7:
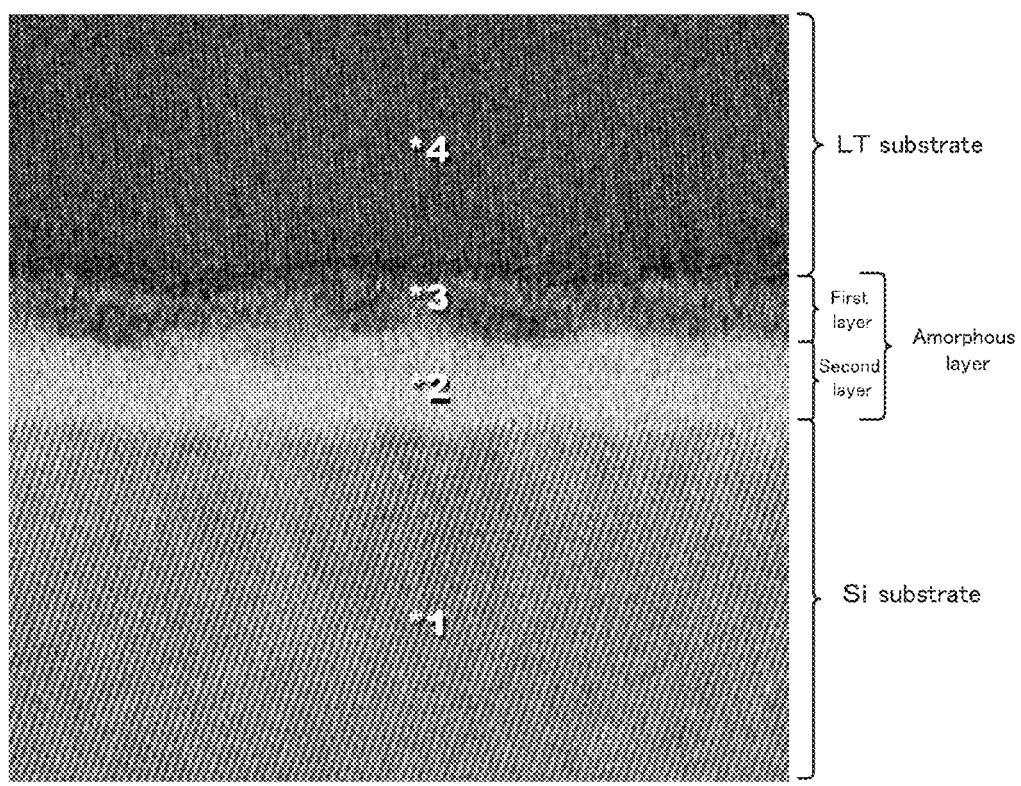
FIG. 7 is a cross-sectional TEM image of a composite substrate of Comparative Example 3.
Figure 8:
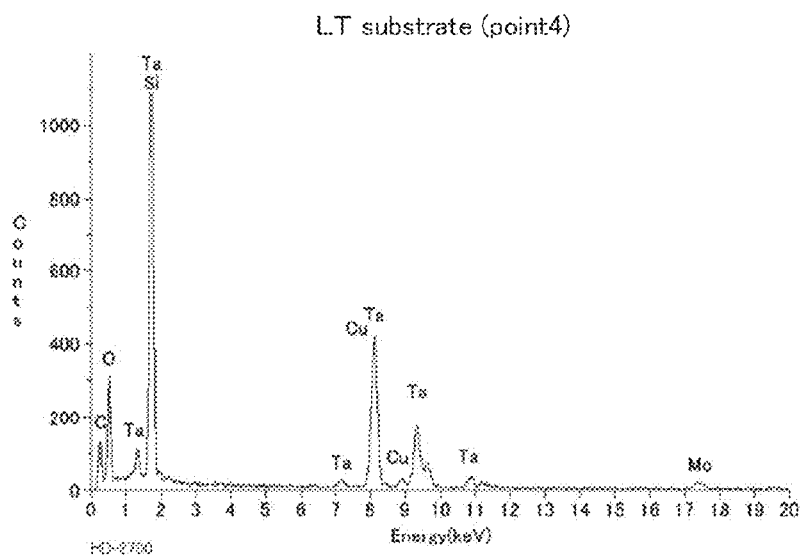
FIG. 8 is an EDX graph of an LT substrate in the composite substrate of Comparative Example 3.
Figure 9:
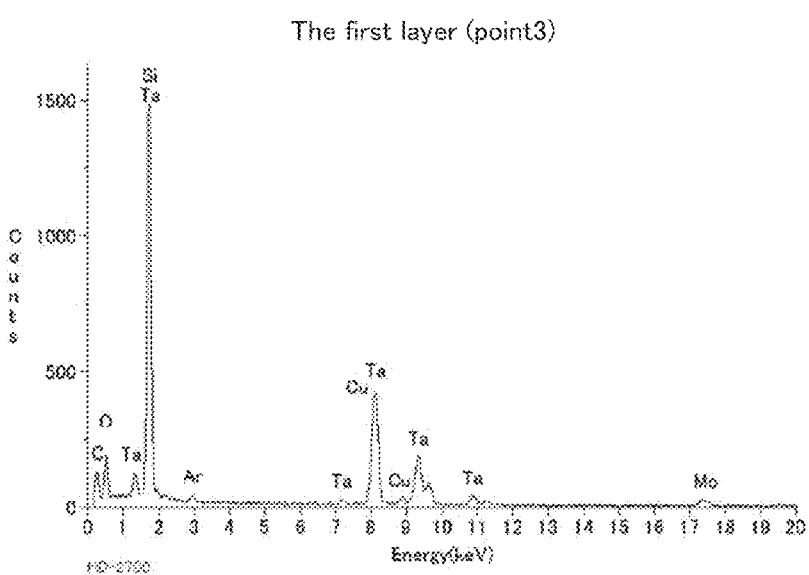
FIG. 9 is an EDX graph of a first layer of an amorphous layer in the composite substrate of Comparative Example 3.
Figure 10:
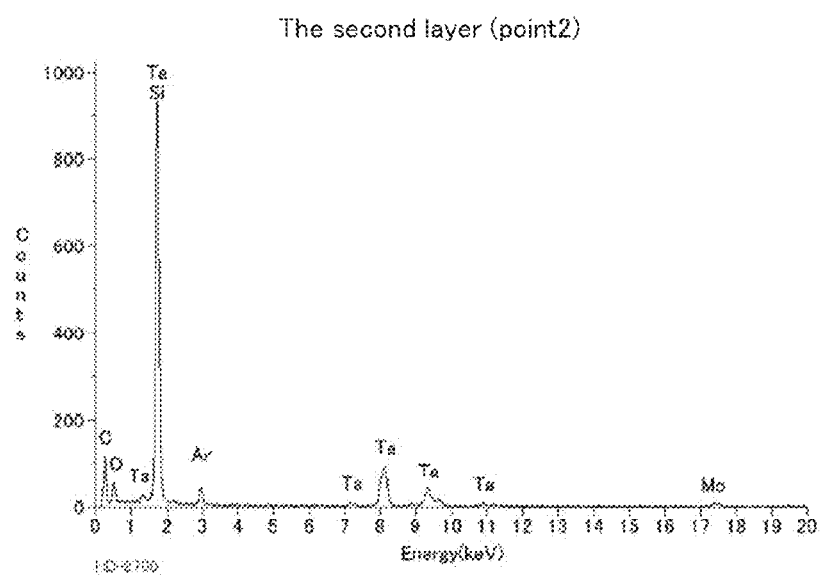
FIG. 10 is an EDX graph of a second layer of the amorphous layer in the composite substrate of Comparative Example 3.
Figure 11:
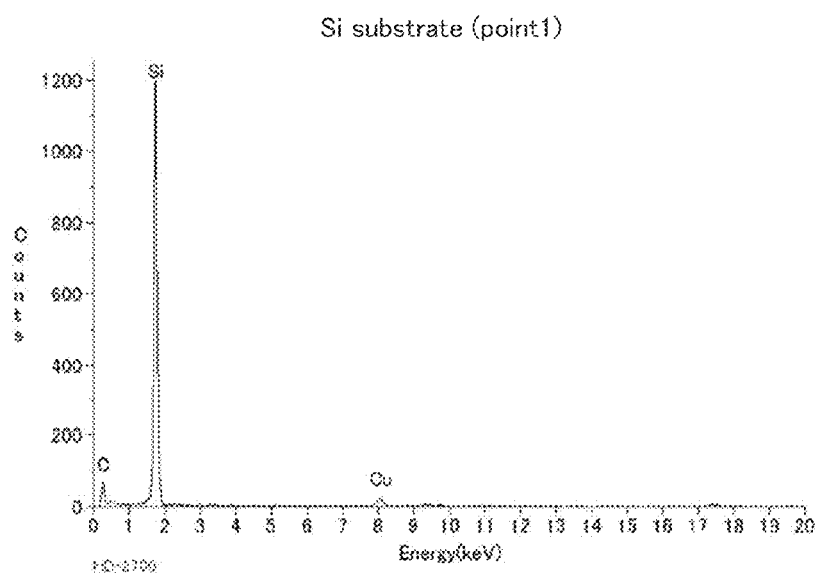
FIG. 11 is an EDX graph of a silicon substrate in the composite substrate of Comparative Example 3.

A composite substrate including an LT substrate, a silicon substrate, and a double-layer amorphous layer joining together the two substrates was obtained, and a portion thereof was cut to examine a cross-section under a TEM as in Example 1. The results are shown in FIG. 7. As shown in FIG. 7, the amorphous layer had a thickness of 5 nm. The amorphous layer included, in order from the LT substrate toward the silicon substrate, a first layer and a second layer. The LT substrate, the first and second layers of the amorphous layer, and the silicon substrate were examined by composition analysis and elemental analysis using EDX. FIGS. 8 to 11 show the results of the composition analysis. As can be seen from the results of the composition analysis, argon was detected in both of the first and second layers. Table 2 shows the results of the elemental analysis. As can be seen from Table 2, the first layer contained 1 atomic percent of argon atoms, and the second layer contained 2 atomic percent of argon atoms. No iron atoms were detected in any portion. The entire amorphous layer contained 2 atomic percent of argon atoms. When a 2 mm square chip cut from the composite substrate was heated on a hot plate, the LT substrate peeled off at 280° C.

TABLE 2

| | | | Element, By Unit of atm % | | | |
|---|---|---|---|---|---|---|
| | | Point | Si | Ar | Ta | Fe |
| LT Substrate | | 4 | 32 | 0 | 68 | 0 |
| Amorphous Layer | First Layer | 3 | 59 | 1 | 40 | 0 |
| | Second Layer | 2 | 93 | 3 | 4 | 0 |
| Si Substrate | | 1 | 100 | 0 | 0 | 0 |

When composite substrates were fabricated with varying times of irradiation with a neutral argon atom beam, and 2 mm square chips cut from the composite substrates were heated on a hot plate, it was found that an amorphous layer containing 3 to 10 atomic percent of argon in its entirety is effective in providing a heat resistance higher than those of Comparative Examples 1 to 3 and that the amorphous layer provides sufficient heat resistance at 400° C. or higher if it has a thickness of 4 to 12 nm. It was also found that an amorphous layer containing 3 to 14 atomic percent of argon in its entirety provides a heat resistance higher than those of Comparative Examples 1 to 3. For any of the composite substrates, the amorphous layer included, in order from the LT substrate toward the silicon substrate, a first layer, a second layer, and a third layer, and the third layer was thicker than the first and second layers. The atomic percentage of argon atoms was higher in the second layer than in the first and third layers. When an argon ion beam was used instead of a neutral argon atom beam, the resulting amorphous layer contained more than 30 atomic percent of iron derived from the vacuum chamber and was also composed of two layers.

Evaluation of Adhesion Strength

Figure 12:
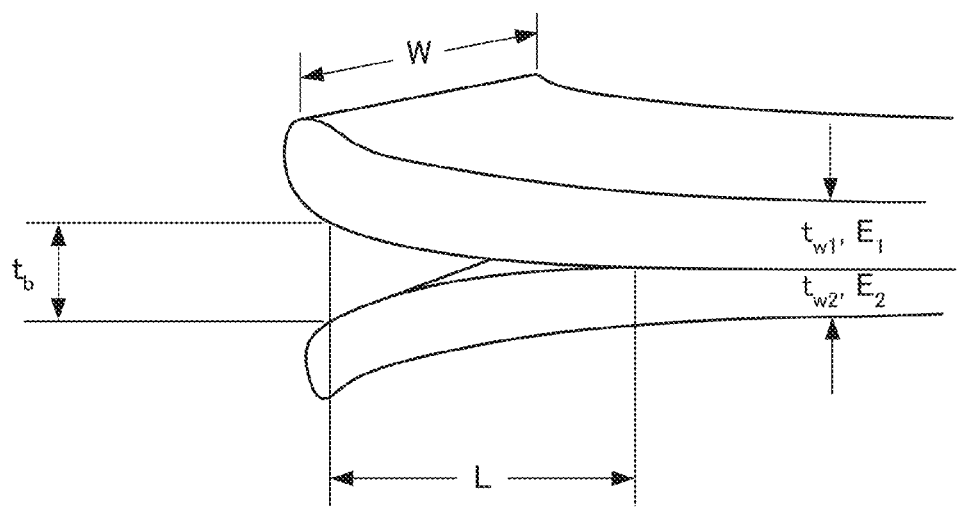
FIG. 12 is an illustration of a crack opening test.

The laminated (unpolished) substrates of Examples 1 to 5 and Comparative Examples 1 to 3 were evaluated for the adhesion strength between the piezoelectric substrate and the support substrate. The adhesion strength was evaluated by a crack opening test (see FIG. 12) as follows. A blade having a thickness ($t_b$) of 100 μm was inserted into the joining interface between the piezoelectric substrate and the support substrate in the laminated substrate to mechanically peel off the two substrates from each other on the periphery thereof. The distance (L) from the blade tip to the farthest position to which peeling propagated was measured, and the surface energy (γ) was calculated by the following equation as the adhesion strength. A laminated substrate of Example 6 was also manufactured by heating (annealing) the unpolished laminated substrate of Example 1 at 80° C. for 72 hours. The laminated substrate of Example 6 was evaluated for adhesion strength in the same manner. The adhesion strength was measured at a plurality of positions for each laminated substrate. The results are shown in Table 3. As can be seen from Table 3, the laminated substrates of Examples 1 to 5 had higher adhesion strengths than the laminated substrate of Comparative Examples 1 to 3, and the laminated substrates of Examples 1 to 3 and 5 had particularly high adhesion strengths. It was also found that the laminated substrate of Example 6 had a higher adhesion strength than the laminated substrate of Example 1.

$$\gamma = \frac{3t_b^2 E_1 t_{w1}^3 E_2 t_{w2}^3}{16L^4(E_1 t_{w1}^3 + E_2 t_{w2}^3)} \quad \text{Equation}$$

γ: surface energy

L: distance from blade tip to farthest position to which peeling propagated $t_{w1}$: thickness of piezoelectric substrate $t_{w2}$: thickness of support substrate $E_1$: Young's modulus of piezoelectric substrate $E_2$: Young's modulus of support substrate $t_b$: thickness of blade

TABLE 3

| Laminated Subatrate | Adhesion Strength (J/m²) |
|---|---|
| Example 1 | 0.9 or more and less than 1.5 |
| Example 2 | 0.9 or more and less than 1.5 |
| Example 3 | 0.9 or more and less than 1.5 |
| Example 4 | 0.9 or more and less than 1.5 |
| Example 5 | 0.9 or more and less than 1.5 |
| Example 6 | 1.5 or more |
| Comparative Example 1 | 0.5 or more and less than 0.9 |
| Comparative Example 2 | 0.5 or more and less than 0.9 |
| Comparative Example 3 | Less than 0.5 |

The present invention is not limited to the above-described embodiment. It is clear that the present invention can be implemented in a variety of embodiments without departing from the technical scope thereof.

The present application claims priority from Japanese Patent Application No. 2012-250071 filed on Nov. 14, 2012, the entire contents of which are incorporated herein by reference.

INDUSTRIAL APPLICABILITY

The present invention is applicable to acoustic wave devices such as SAW devices.

What is claimed is:

1. A composite substrate comprising a piezoelectric substrate that is a single-crystal substrate composed of lithium tantalate or lithium niobate, a support substrate that is a single-crystal silicon substrate, and an amorphous layer joining together the piezoelectric substrate and the support substrate, wherein the amorphous layer contains 3 to 14 atomic percent of Ar.

2. The composite substrate according to claim 1, wherein the amorphous layer has a thickness of 4 to 12 nm.

3. The composite substrate according to claim 1, wherein the amorphous layer includes, in order from the piezoelectric substrate toward the support substrate, a first layer, a second layer, and a third layer, the first layer containing a larger amount of a constituent element of the piezoelectric substrate than the second and third layers, the third layer containing a larger amount of a constituent element of the support substrate than the first and second layers, the second layer containing a larger amount of Ar than the first and third layers.

4. The composite substrate according to claim 3, wherein the third layer is thicker than the first and second layers.

5. The composite substrate according to claim 1, wherein an Fe content is less than 0.1 atomic percent.

\* \* \* \* \*